United States Patent
Groen et al.

(10) Patent No.: US 6,515,572 B2
(45) Date of Patent: *Feb. 4, 2003

(54) CIRCUIT ARRANGEMENT COMPRISING AN SMD-COMPONENT, IN PARTICULAR A TEMPERATURE SENSOR, AND A METHOD OF MANUFACTURING A TEMPERATURE SENSOR

(75) Inventors: Wilhelm A. Groen, Limbricht (NL); Valerie R. C. M. J. Sillen, Kessel-Lo (BE)

(73) Assignee: Koninklijke Philips Electronics N.V., Eindhoven (NL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/139,201

(22) Filed: Aug. 24, 1998

(65) Prior Publication Data

US 2002/0050921 A1 May 2, 2002

(30) Foreign Application Priority Data

Aug. 23, 1997 (DE) .......................... 197 36 855

(51) Int. Cl.[7] .............................. H01C 7/10; H01C 7/13
(52) U.S. Cl. ...................... 338/22 R; 338/309; 29/610.1
(58) Field of Search ................ 338/22 R, 308, 338/309, 307, 225 D; 29/610, 610.1, 621, 620

(56) References Cited

U.S. PATENT DOCUMENTS

| | | | | |
|---|---|---|---|---|
| 4,087,778 A | * | 5/1978 | Merz et al. ................ | 338/209 |
| 4,684,916 A | * | 8/1987 | Ozawa ....................... | 338/309 |
| 4,695,504 A | * | 9/1987 | Watanabe et al. .......... | 428/209 |
| 4,758,814 A | * | 7/1988 | Howng et al. .............. | 338/34 |
| 4,910,643 A | * | 3/1990 | Williams .................... | 361/414 |
| 5,196,915 A | * | 3/1993 | Ito et al. .................... | 257/379 |
| 5,339,068 A | * | 8/1994 | Tsunoda et al. ............ | 338/332 |
| 5,425,647 A | * | 6/1995 | Mencik et al. .............. | 439/83 |
| 5,491,118 A | * | 2/1996 | Hormadaly .................. | 501/20 |
| 5,534,843 A | * | 7/1996 | Tsunoda et al. .......... | 338/22 R |
| 5,560,098 A | * | 10/1996 | Robins ......................... | 29/621 |
| 5,955,937 A | | 9/1999 | Groen ......................... | 338/22 |
| 6,248,978 B1 | * | 6/2001 | Okuda ......................... | 219/216 |

FOREIGN PATENT DOCUMENTS

| | | | |
|---|---|---|---|
| DE | 0810611 A1 | 12/1997 | |
| EP | 0809094 | 11/1997 | ............ G01K/7/18 |
| JP | 491401 A | 3/1992 | |

OTHER PUBLICATIONS

U.S. patent application Ser. No. 08/863,990, Groen, filed May 28, 1997.

* cited by examiner

*Primary Examiner*—Elvin Enad
*Assistant Examiner*—Kyung S. Lee

(57) ABSTRACT

The invention relates to a circuit arrangement comprising an SMD-component (1), in particular a temperature sensor with a thermistor element (1), having two electroconductive contacts (2a, 2b), which are each conductively connected to a conductor track (3a, 3b) provided on a substrate (4). A firm, mechanical connection as well as a good electroconductive connection between the SMD-component and the conductor tracks is achieved in that the contacts (2a, 2b) are each made of a metal-glass layer (6) forming the connection to the conductor tracks (3a, 3b), and in that the metal-glass layer (6) is manufactured by heating a glass particle-containing metal until melting or softening of the glass particles occurs. The invention also relates to a method of manufacturing a temperature sensor and to a method of manufacturing such a connection.

20 Claims, 1 Drawing Sheet

CIRCUIT ARRANGEMENT COMPRISING AN SMD-COMPONENT, IN PARTICULAR A TEMPERATURE SENSOR, AND A METHOD OF MANUFACTURING A TEMPERATURE SENSOR

The invention relates to a circuit arrangement comprising an SMD-component (surface mounted device), in particular a temperature sensor with a thermistor element, having two electroconductive contacts, which are each conductively connected to a conductor track provided on a substrate. The invention further relates to a method of manufacturing a temperature sensor as well as to a method of manufacturing an electroconductive connection between a contact of an SMD-component and a conductor track on a substrate.

Such a temperature sensor is known from JP-A 4-91401. In said document, the thermistor element is a thin-film element provided on the surface of an aluminium supporting element. On either side of the thermistor element, a film electrode is arranged on the supporting element. To manufacture electroconductive connections between the electrodes and the conductor tracks on a substrate, both the supporting element and the electrodes are provided with a bore hole through which an electroconductive element is passed so as to connect the electrode and the conductor track to each other.

It is an object of the invention to provide a circuit arrangement as mentioned in the opening paragraph, comprising an SMD-component with improved contacts, a temperature sensor which can be readily manufactured as well as a simple method of manufacturing a temperature sensor.

The objects regarding the circuit arrangement and the temperature sensor are achieved in that each of the contacts is made of a metal-glass layer forming the connection to the conductor tracks, and in that said metal-glass layer is prepared by heating a glass particle-containing metal until melting or softening of said glass particles occurs.

The contacts in the form of a metal-glass layer form an electroconductive connection (due to the metal content) as well as a firm mechanical connection (due to the glass produced by melting or heating the glass particles and, subsequently, cooling) to the conductor tracks. Expensive bore holes, as provided in the known temperature sensor, to maximize the insulating distance between the thermistor element and the soldered connections on the conductor tracks, are not required in the circuit arrangement and temperature sensor in accordance with the invention because the glass of the metal-glass layer does not melt at the temperatures to be measured and hence the mechanical connection cannot be destroyed.

In an embodiment of the invention, the contacts comprise silver, copper, gold, platinum or an alloy including such a material, for example a platinum alloy. The choice of the metal depends on the application, in particular on the temperatures to be measured. Particularly platinum is suitable for high temperatures up to approximately 1100° C. The same applies to a further embodiment of the invention, in which the conductor tracks are composed of silver, copper, gold, platinum or an alloy including such a material.

Preferably, in a further embodiment of the invention, the thermistor element is composed of a semiconductive ceramic material. Particularly a semiconductor ceramic of a mixed-crystal oxide of the rare earth metals exhibits a very good high-temperature stability and long-term stability and can suitably be used for a temperature sensor to measure high temperatures up to 1100° C. Such thermistor elements are described in EP 0810611, which corresponds to U.S. Pat. No. 5,955,937. Thermistor elements composed of semiconductor ceramic also have the advantage that they supply a large output signal and that, consequently, the necessary circuit arrangement for processing the signals can be of a relatively simple construction as compared to the circuit arrangement necessary for a state-of-the-art thermoelement.

To preclude that the metal contacts are subject to oxidation at higher temperatures and, if necessary, to strengthen the mechanical connection between the thermistor element and the substrate, in an embodiment in accordance with the invention, the thermistor element and/or the contacts is/are covered with a layer composed of a glass and/or ceramic material. This layer can be manufactured by dipping the thermistor element, which is already connected to the conductor tracks, into a paste containing glass and/or ceramic powder, and subsequently heating it in a furnace at a temperature below the melting temperature of the glass of the contact-forming metal-glass layers. In this process, the glass melts in the paste or the ceramic powder is baked, resulting in the formation of a solid layer.

The object of providing a method of manufacturing a temperature sensor is achieved in that, to form contacts, a metal paste comprising glass particles is provided on two end faces of a thermistor element, each of said contacts being brought into contact with a conductor track provided on a substrate, and said contacts being heated until melting or softening of the glass particles takes place, and subsequently cooled. This method can be used to manufacture temperature sensors having a negative temperature coefficient (NTCs), whose resistance decreases as the temperature increases, as well as to manufacture temperature sensors having a positive temperature coefficient (PTCs), whose resistance increases as the temperature increases. The contacts are preferably heated in a furnace, however, it is alternatively possible to heat the contacts by means of a hot-gas beam or otherwise, without causing damage to the thermistor element.

The invention also relates to a method of manufacturing an electroconductive connection between a contact of an SMD-component and a conductor track on a substrate, characterized in that, to form said contact, a metal paste comprising glass particles is provided on a surface of the SMD-component, which contact is brought into contact with the conductor track and said contact is heated until melting or softening of the glass particles occurs, and subsequently cooled. This enables, for example, customary SMD-resistors or SMD-capacitors to be mechanically rigidly provided on a substrate.

The temperature sensors in accordance with the invention can particularly suitably be used to measure high temperatures, particularly in the range between 500° C. and 1100° C., for example the exhaust-gas temperature or catalytic-converter temperature of motor vehicles, or as a thermostat in motor-control systems. However, the temperature sensors in accordance with the invention can also be used for industrial waste-gas temperature measurements.

Figure 1:
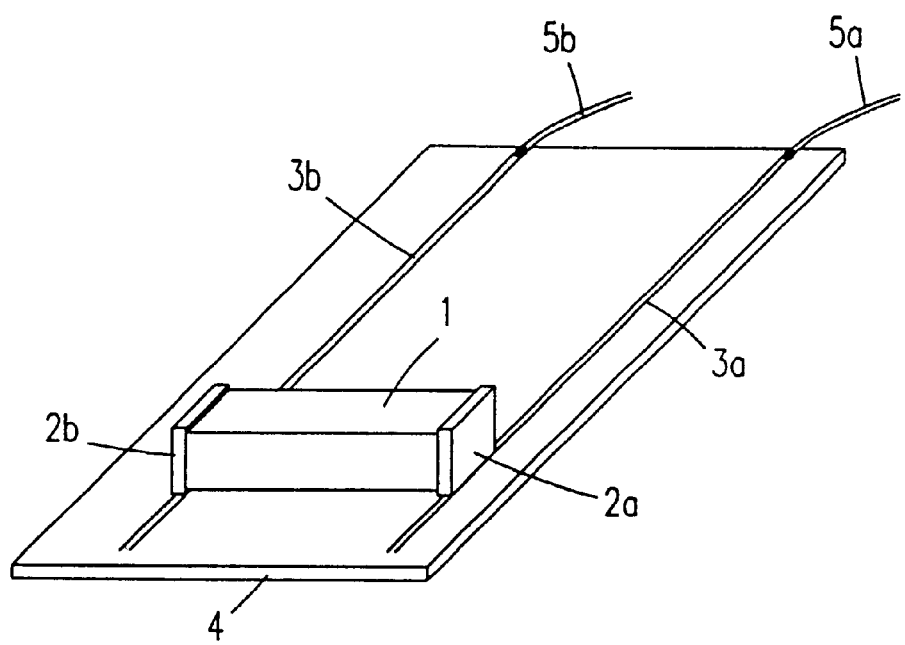
FIG. 1 shows a temperature sensor in accordance with the invention.

FIG. 1 shows a rectangular thermistor element 1 comprising an electroconductive contact 2a and 2b on two lateral end faces. Each of the contacts 2a, 2b is electroconductively and rigidly connected to a conductor track 3a, 3b, respectively, which conductor tracks are provided, for example photolithographically, on a substrate 4. Connecting leads 5a, 5b are soldered to the conductor tracks 3a, 3b, respectively, at a distance from the thermistor element 1, at the location of the end of the substrate 4, i.e. the cold end (as opposed to the hot end of the substrate 4 where the thermistor element 1 is arranged). To manufacture the contacts 2a, 2b, first, the end faces of the thermistor element are dipped into a paste which is predominantly composed of platinum to which glass particles (approximately 1 to 10% by weight glass, for example in powdered form having particle sizes in the range from 1 to 10 µm) are added. In addition, the paste comprises suitable binding agents and solvents. The paste also contains the platinum in powdered form. Subsequently, the thermistor element 1 is arranged on the substrate 4 in such a manner that the contacts 2a, 2b and the conductor tracks 3a, 3b are in contact with each other. In a heating operation at a high temperature, first the binding agents and solvents are burned and, depending upon the type of glass and the temperature, the glass particles start to melt or soften (for example at 1300° C.). Subsequently, the powdered platinum is sintered together in the melted glass and, after the glass has solidified in the subsequent cooling operation, the platinum and the glass together form a solid metal-glass layer which forms the contact 2a or 2b. As a result, a firm mechanical connection (adhesion) between, respectively, the contacts 2a, 2b and the conductor tracks 3a, 3b is achieved which, since the main constituent in the metal-glass layer is platinum, is electroconductive.

Figure 2:
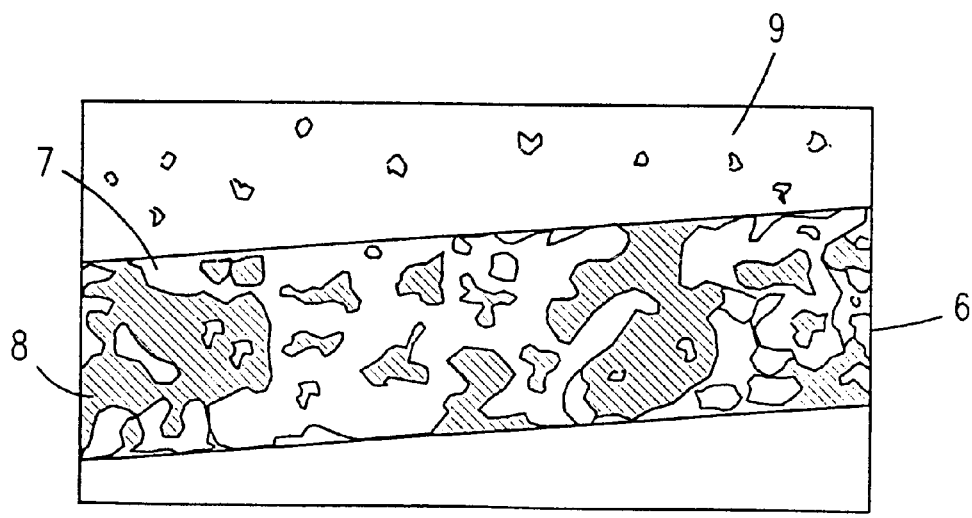
FIG. 2 shows the metal-glass layer on an enlarged scale.

FIG. 2 shows the metal-glass layer 6 on the ceramic 9 of the thermistor element 1 on an enlarged scale. This Figure shows the hardened glass 8 in which the sintered-together platinum 7 is distributed in a non-uniform manner. The hardened glass 8 also brings about the firm connection with the ceramic 9.

As is shown in FIGS. 1 and 2, the opposed end faces of the thermistor element 1 are substantially parallel to each other, and the thermistor element 1 is a unitary body of material directly contacted by the solid metal-glass layer which forms the contact 2a or 2b.

The temperature at which the glass melts or softens is dependent upon the glass type used and must of course be higher than the highest temperature to be measured by the temperature sensor. The glass-particle content in the paste must be sufficiently large because, otherwise, it would be impossible to attain a sufficiently firm connection between the contacts 2a, 2b and the conductor tracks 3a, 3b, respectively. On the other hand, the glass-particle content must not be too large because, otherwise, there would be no, or only a poor, electroconductive connection between the thermistor element 1 and the contacts 2a, 2b. For the substrate 4, use can particularly suitably be made of aluminium oxide or also BeO, MgO, AlN or other materials which are resistant to high temperatures.

What is claimed is:

1. A circuit arrangement comprising a substrate having two conductor tracks and an SMD-component having two opposed end faces and two electroconductive contacts on respective said end faces, which contacts are each conductively connected to a respective one of said conductor tracks, characterized in that each of the contacts is a layer of glass particle-containing metal forming the connection to the conductor tracks by electrical and mechanical connection, the glass particles of the metal-glass layer having a melting or softening temperature, at which said glass particles adhere to the respective end faces and conductor tracks, higher than an operating temperature of the arrangement.

2. A circuit arrangement as claimed in claim 1, characterized in that the contacts (2a, 2b) comprise silver, copper, gold, platinum or an alloy including such a material.

3. A circuit arrangement as claimed in claim 1, characterized in that the conductor tracks (3a, 3b) are composed of silver, copper, gold, platinum or an alloy including such a material.

4. A circuit arrangement as claimed in claim 1, characterized in that said two opposed end faces are substantially parallel.

5. A circuit arrangement as claimed in claim 4, characterized in that said SMD-component is covered with a layer composed of a glass and/or ceramic material.

6. A circuit arrangement as claimed in claim 1, characterized in that said SMD-component is formed by a unitary body having said two opposed end faces.

7. A circuit arrangement as claimed in claim 6, characterized in that said two opposed end faces are substantially parallel.

8. A circuit arrangement as claimed in claim 1, characterized in that said SMD-component consists of semiconductive material having said two opposed end faces.

9. A circuit arrangement as claimed in claim 8, characterized in that said semiconductive material is a semiconductive ceramic material.

10. A circuit arrangement as claimed in claim 8, characterized in that said two opposed end faces are substantially parallel.

11. A temperature sensor comprising a substrate having two conductor tracks and a thermistor element having two opposed end faces and two electroconductive contacts on respective said end faces, which contacts are each conductively connected to a respective one of said conductor tracks, characterized in that each of the contacts is a layer of glass particle-containing metal forming the connection to the conductor tracks by electrical and mechanical connection, the glass particles of the metal-glass layer having a melting or softening temperature, at which said glass particles adhere to the respective end faces and conductor tracks, higher than a highest temperature to be sensed by the sensor.

12. A temperature sensor as claimed in claim 11, characterized in that the thermistor element (1) is composed of a semiconductive ceramic material, particularly a mixed crystal oxide of the rare earth metals.

13. A temperature sensor as claimed in claim 11, characterized in that the thermistor element (1) and/or the contacts (2a, 2b) is/are covered with a layer composed of a glass and/or ceramic material.

14. A temperature sensor as claimed in claim 11, characterized in that said two opposed end faces are substantially parallel.

15. A temperature sensor as claimed in claim 11, characterized in that said thermistor element consists of a semiconductive ceramic material.

16. A temperature sensor as claimed in claim 15, characterized in that said two opposed end faces are substantially parallel.

17. A temperature sensor as claimed in claim 15, characterized in that said thermistor element consists of a semiconductive ceramic material partially covered with a layer composed of a glass and/or ceramic material.

18. A temperature sensor as claimed in claim 15, characterized in that said two opposed end faces are substantially parallel.

19. A method of manufacturing an electroconductive connection between a contact of an SMD-component having an end face opposed to an other end of the SMD-component, and a conductor track on a substrate, characterized in that, to form said contact, a metal paste comprising glass particles is provided on said end face of the SMD-component, which contact is brought into contact with the conductor track and said contact is heated until melting or softening of the glass particles occurs, and subsequently cooled.

20. A method of manufacturing a temperature sensor, said method comprising:

providing a thermistor element having a pair of opposed end faces, applying a paste comprising metal and glass particles to each of said end faces, thereby forming a contact on each of said end faces, bringing each of said contacts into contact with a respective conductor track provided on a substrate, heating said contacts until softening or melting of the glass particles occurs, thereby connecting the contacts to the respective tracks, and cooling the contacts.

* * * * *